(12) United States Patent
Hensley et al.

(10) Patent No.: US 7,238,893 B2
(45) Date of Patent: Jul. 3, 2007

(54) EXPANDABLE ELECTROMAGNETIC INTERFERENCE (EMI) GASKET MECHANISM

(75) Inventors: James Hensley, Rocklin, CA (US); Andrew H. Dickson, Fair Oaks, CA (US); Andrew M. Cherniski, Rescue, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 283 days.

(21) Appl. No.: 10/667,832

(22) Filed: Sep. 22, 2003

(65) Prior Publication Data

US 2005/0061526 A1    Mar. 24, 2005

(51) Int. Cl.
*H05K 9/00* (2006.01)

(52) U.S. Cl. ............... 174/351; 174/382; 361/800; 361/801; 361/797

(58) Field of Classification Search ........... 174/35 GC, 174/382, 351; 277/920; 49/477.1; 361/800, 361/801, 797
See application file for complete search history.

(56) References Cited

U.S. PATENT DOCUMENTS

| | | | | |
|---|---|---|---|---|
| 4,371,175 A | * | 2/1983 | Van Dyk, Jr. .......... | 174/35 GC |
| 4,399,317 A | * | 8/1983 | Van Dyk, Jr. .......... | 174/35 GC |
| 4,710,590 A | | 12/1987 | Ekdahl .................. | 174/35 |
| 4,746,765 A | * | 5/1988 | Mallott ................. | 174/35 GC |
| 5,115,104 A | | 5/1992 | Bunyan ................. | 174/35 |
| 5,233,507 A | | 8/1993 | Günther et al. | |
| 5,578,790 A | | 11/1996 | Peregrim .............. | 174/35 |
| 5,581,048 A | * | 12/1996 | Shores ................. | 174/35 GC |
| 5,712,449 A | | 1/1998 | Miska et al. ......... | 174/35 |
| 6,078,504 A | * | 6/2000 | Miles ................... | 361/727 |
| 6,121,545 A | | 9/2000 | Peng et al. .......... | 174/35 |
| 6,775,131 B2 | * | 8/2004 | Hanson ............... | 361/685 |

FOREIGN PATENT DOCUMENTS

FR         2672461        8/1992
WO     WO 97/23124 A1    6/1997

OTHER PUBLICATIONS

Great Britain Search Report. Application No. GB0420852.6. Feb. 14, 2005.

* cited by examiner

*Primary Examiner*—Hung V. Ngo

(57) ABSTRACT

A resilient, electrically conductive EMI gasket is disposed between two jaws. A cam-lever or other actuator is operably linked to the jaws. The cam-lever can be used to drive the jaws closer together, thereby squeezing the gasket and causing a portion of the gasket to protrude, preferably beyond an edge of at least one of the jaws. The protruding portion of the gasket contacts a mating surface of an opening, through which a device was installed, or a mating surface on an adjacent device. This contact seals the space between the EMI gasket mechanism and the mating surfaces, i.e. the contact closes a gap and thus maintains a continuous EMI shield therebetween. The gap is closed against passage of EMI radiation without relying on device insertion force to cause the EMI gasket to adequately contact the mating surface. Alternatively, an inflatable resilient EMI gasket is in fluid communication with a pump, and an actuator is operably linked to the pump. The actuator can be used to operate the pump and, thereby, inflate the gasket, thus causing a portion of the gasket to protrude and contact a mating surface.

24 Claims, 6 Drawing Sheets

EXPANDABLE ELECTROMAGNETIC INTERFERENCE (EMI) GASKET MECHANISM

BACKGROUND OF THE INVENTION

1. Field of the Invention

The present invention relates generally to electromagnetic interference (EMI) shielding and, more particularly, to EMI shielding that includes an expanding EMI gasket.

2. Related Art

Operation of electronic devices, such as televisions, radios, computers, medical instruments, business machines, communications equipment, and the like, generates undesirable electromagnetic interference (EMI) radiation. This EMI radiation often develops as a field or as transients within a radio frequency band, generally between about 10 KHz and 10 GHz, of the electromagnetic spectrum. EMI radiation can cause problems, because EMI radiation can interfere with proper operation of other electronic devices.

EMI shielding is commonly used to control EMI radiation. EMI shielding is typically constructed of an electrically-conductive material and is configured to absorb EMI radiation and allow the absorbed EMI radiation to flow to an electrical ground via a low-impedance radio-frequency (RF) path. EMI shielding may be employed to confine EMI radiation generated by a device or to protect the device from EMI radiation generated by other devices. Commonly, EMI shielding is provided as a housing that encloses a device or as a barrier that is inserted between pairs of devices.

To date, EMI control has proven difficult due to the ability of EMI radiation to travel through small gaps in EMI shielding. Despite being housed in EMI shielded device housings, electronic devices often receive or generate EMI radiation that enters or escapes through gaps in the device housings. For example, these device housings often have access ports, lids or side panels that provide access to devices enclosed by the device housings. Imperfect fit of these access ports, etc. can leave gaps large enough to pass significant amounts of EMI radiation. These gaps are especially common in so-called "blade systems," which permit replaceable printed circuit boards (blades) to be plugged into the chassis through openings in front panels of the chassis.

To prevent, or at least minimize, EMI radiation from escaping or entering a blade system, each blade typically includes a handle, filler panel, bulkhead or other structure (hereinafter collectively referred to as a "bulkhead") that includes an EMI shield. The bulkhead is configured and sized such that, when the blade is installed in a chassis, the bulkhead fills the opening, through which the blade was installed. Surfaces, edges, flanges or other structures (hereinafter collectively referred to as "surfaces" or "mating surfaces") on the perimeter of the bulkhead are generally configured to mate with corresponding surfaces around the perimeter of the opening when the blade is installed in the chassis. Unfortunately, even strict manufacturing tolerances have proven insufficient to adequately prevent EMI radiation from passing through gaps between these mating surfaces. Therefore, a resilient, electrically-conductive EMI gasket is often attached to the perimeter surfaces of either the bulkhead or the structures that define the opening. Thus, when the blade is installed, the EMI gasket is compressed between mating surfaces of the bulkhead and the opening. (Hereinafter, a "surface" or "mating surface" also includes an EMI gasket, if one is present at a point or line of contact between a bulkhead or opening and another object.)

The compressive force between these mating surfaces is intended to urge the EMI gasket to fill any gaps, and thus maintain a continuous EMI shield, between these mating surfaces. However, large forces are required to simultaneously plug the blade into a socket of the chassis and compress the EMI gasket sufficiently to fill the gaps. These forces can unduly stress the blade or damage components or printed circuit wiring on the blade. These forces can also distort the bulkhead or opening and, thereby, cause other gaps to occur between the mating surfaces or cause existing gaps between the mating surfaces to enlarge. Furthermore, an EMI gasket's effectiveness depends on the gasket's resilience. However, the large forces necessary to compress an EMI gasket often permanently deform it or reduce its resilience, thereby making the gasket less effective or ineffective for reuse.

Some blade system chassis do not have discrete openings in their front panels for each blade. Instead, each front panel includes one large opening, through which a plurality of blades can be installed adjacent one another. In this type of blade system, an EMI gasket on each blade is intended to contact a mating surface of the adjacent blade. However, some permanently deformed, i.e. undersized, EMI gaskets or an accumulation of dimensional errors in the plurality of adjacent bulkheads can lead to an overly tight or overly loose fit among the bulkheads in a fully-populated chassis. An overly loose fit leads to gaps in the EMI shielding, whereas an overly tight fit makes it difficult or impossible to install the final blade without excessive insertion force.

There is, therefore, a need for an effective EMI sealing mechanism that can be used in blade systems without the problems of the prior art.

SUMMARY OF THE INVENTION

In one aspect of the invention, an EMI gasket mechanism for sealing a space anterior to a surface, thereby inhibiting or preventing passage of EMI radiation through the space, is disclosed. the EMI gasket mechanism comprises a first jaw and a second jaw spaced apart from the first jaw by a distance, the first and second jaws defining a region therebetween. The EMI gasket mechanism also comprises a resilient EMI gasket disposed in the region between the first and second jaws. The EMI gasket mechanism also comprises an actuator operably linked to the first and second jaws and configured to reduce the distance between the first and second jaws when the actuator is activated, thereby squeezing the resilient EMI gasket between the first and second jaws and causing a portion of the resilient EMI gasket to protrude. When the resilient EMI gasket is squeezed, the protruding portion of the resilient EMI gasket is forced into contact with the surface, thereby sealing the space anterior to the surface against passage of EMI radiation.

In another aspect of the invention, an EMI gasket mechanism for sealing a space anterior to a surface, thereby inhibiting or preventing passage of EMI radiation through the space, is disclosed. The EMI gasket mechanism comprises an inflatable resilient EMI gasket and a pump in fluid communication with the inflatable resilient EMI gasket. The EMI gasket mechanism also comprises an actuator operably linked to the pump and configured to operate the pump when the actuator is activated, thereby inflating the resilient EMI gasket and causing a portion of the resilient EMI gasket to protrude. When the inflatable resilient EMI gasket is completed, the protruding portion of the resilient EMI gasket is forced into contact with the surface, thereby sealing the space anterior to the surface against passage of EMI radiation.

In yet another aspect of the invention, a method of sealing a space anterior to a surface, thereby inhibiting or preventing passage of EMI radiation through the space, is disclosed. The method comprises positioning a resilient EMI gasket in the space anterior to the surface and squeezing the resilient EMI gasket, thereby causing a portion of the resilient EMI gasket to protrude and contact the surface.

In a further aspect of the invention, a method of sealing a space anterior to a surface, thereby inhibiting or preventing passage of EMI radiation through the space, is disclosed. the method comprises positioning an inflatable resilient EMI gasket in the space anterior to the surface and inflating the inflatable resilient EMI gasket, thereby causing a portion of the inflatable resilient EMI gasket to protrude and contact the surface.

In yet a further aspect of the invention, a method of installing a device in a housing, wherein installation of the device requires sealing a space between the device and a mating surface on the housing or on an adjacent device against passage of EMI radiation through the space, is disclosed. The method comprises inserting the device into the housing and, after the device has been inserted into the housing, actuating an EMI gasket mechanism that does not rely on insertion force applied to the device.

BRIEF DESCRIPTION OF THE DRAWINGS

These and other features and advantages of the present invention, as well as structure and operation of various embodiments of the present invention, are described in detail below with reference to the accompanying drawings. In the drawings, like references numerals indicate identical or functionally similar items, and the first digit of each reference numeral of each item identifies a figure, in which the item is first introduced.

DETAILED DESCRIPTION

Figure 1A:
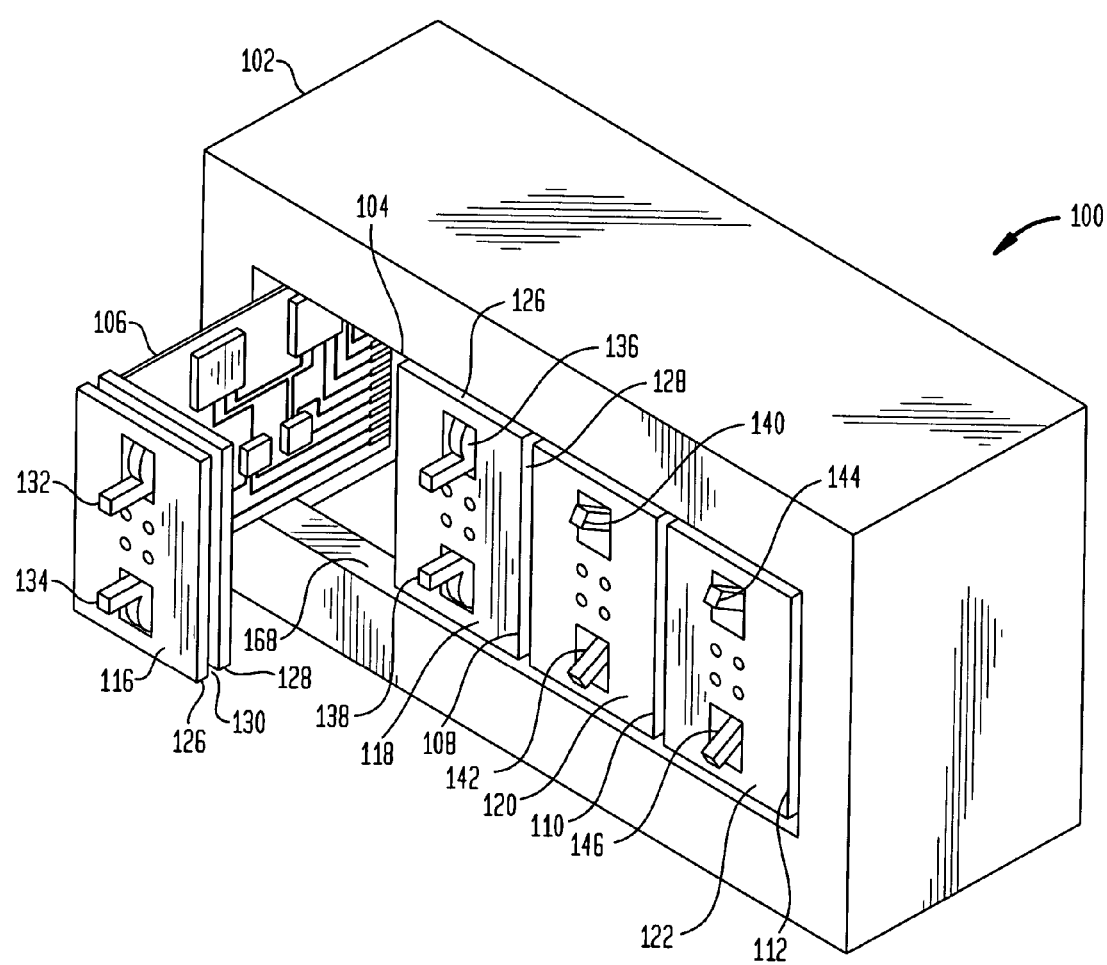
FIGS. 1A–B are perspective views of an exemplary blade system and a blade therefrom, in which embodiments of the present invention can be practical.

The present invention provides apparatus and methods for sealing a space, i.e. closing a gap, against passage of EMI radiation. This is accomplished with an EMI gasket, but without relying on insertion force to cause the EMI gasket to adequately contact a mating surface. These apparatus and methods can be used on bulkheads of blades and other insertable electronic components, such as power supplies, as well as on lids, panels, covers, access doors and other openable, insertable or removable items that provide or utilize EMI shielding. For simplicity, these items are collectively hereinafter referred to as "devices", and their installation, insertion, attachment, closing, or other operations that require sealing a space, i.e. closing a gap, against passage of EMI radiation are collectively hereinafter referred to as "installation".

Embodiments of the invention provide EMI gasket mechanisms that can be actuated independent of installing devices that utilize or benefit from these mechanisms. Such an EMI gasket mechanism is typically actuated after a device is installed. Thus, actuation of the EMI gasket mechanism does not contribute to, nor rely on insertion force used to install the device.

A first embodiment includes a resilient EMI gasket disposed between a plate and a compression ring. This embodiment also includes a cam-lever or other actuator operably linked to the plate and compression ring. The cam-lever can be used to drive the plate and compression ring closer together, thereby squeezing the resilient EMI gasket and causing a portion of the gasket to protrude, preferably beyond an edge of the plate. The protruding portion of the gasket contacts a mating surface of an opening, through which a device was installed, or a mating surface on an adjacent device. This contact seals the space between the EMI gasket mechanism and the mating surfaces, i.e. the contact closes a gap and thus maintains a continuous EMI shield therebetween.

A second embodiment includes an inflatable resilient EMI gasket, a pump connected to the inflatable resilient EMI gasket and a cam-lever or other actuator operably linked to the pump. The pump can be, for example, a bladder. The cam-lever can be used to operate the pump and, thereby, inflate the inflatable resilient EMI gasket, thus causing a portion of the gasket to protrude and contact a mating surface.

For purposes of providing an example, the present invention is described in the context of a blade system. As described in more detail below, an EMI gasket mechanism can be used on one or more mating surfaces of a bulkhead of a blade or an opening in a blade system chassis. Thus, the blade can be installed in the chassis, and then the EMI gasket mechanism can be actuated to seal a space between the blade's bulkhead and an adjacent mating surface. One of ordinary skill in the art can, however, apply the teachings herein to other situations in which passage of EMI radiation must be inhibited or prevented, examples of which are provided above and below.

The following description includes two sections. The first section describes the embodiment that employs a resilient EMI gasket, and the second section describes the embodiment that employs an inflatable resilient EMI gasket.

Figure 1B:
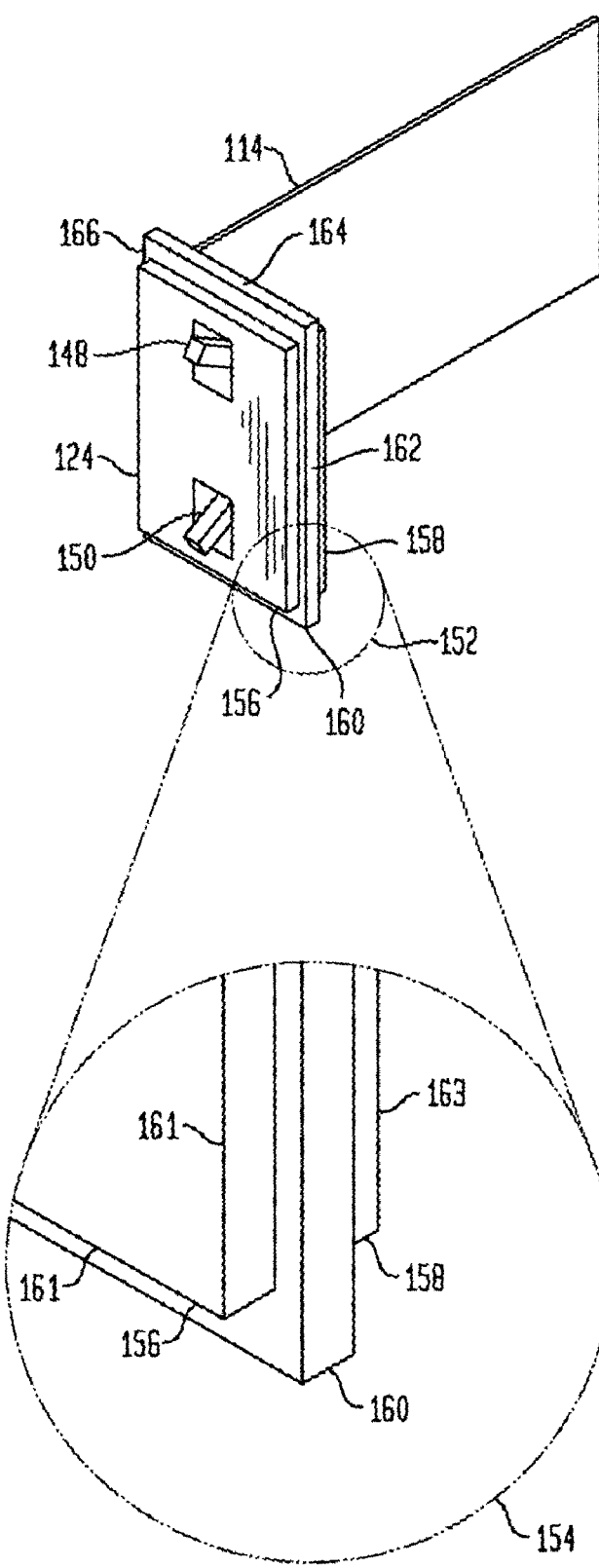

FIGS. 1A–B contain diagrams illustrating an exemplary blade system 100 and several blades 106, 108, 110, 112 and 114 that are, or could be, installed in the blade system, to illustrate how an embodiment of the present invention can be advantageously practiced. The blade system 100 includes a housing 102 having an opening 104, through which blades can be inserted. The blade system 100 includes a backplane with sockets (not shown), into which the blades can be plugged, as is well-known in the art. The blade system 100 is shown with blade 106 partially inserted into the blade system and blades 108, 110 and 112 fully inserted therein. To facilitate understanding of this embodiment of the invention, FIG. 1B shows blade 114 separate from, i.e. not inserted into, the blade system 100.

Focusing primarily on FIG. 1A, the blade system housing 102 includes an EMI shield (not shown), thus providing an EMI-shielded housing for blades inserted therein, as is well-known in the art. Blade 106 includes a bulkhead 116, which includes an EMI shield (not shown), also as is well-known in the art. Similarly, the other blades 108–114 include bulkheads 118, 120, 122 and 124, respectively, each of which includes an EMI shield (not shown). Absent an EMI gasket, gaps, such as those shown at 126 and 128, would typically remain around the bulkheads 118–122 of the installed blades 108–112.

According to a practice of the invention, each bulkhead 116–124 includes an EMI gasket mechanism. As illustrated with respect to blade 106, this mechanism includes two jaws 126 and 128 and a resilient, expandable EMI gasket (not visible) in the space 130 between the jaws. The blade 106 includes preferably two cam-levers 132 and 134 to actuate the EMI gasket mechanism. These cam-levers 132 and 134 are shown in unengaged positions, i.e. positions in which the EMI gasket mechanism of the blade 106 is not actuated. Each of the other blades 108–114 also includes two cam-levers 136, 138, 140, 142, 144, 146, 148 and 150 to actuate their respective EMI gasket mechanisms. The cam levers 136 and 138 of blade 108 also shown in unengaged positions. On the other hand, the cam-levers 140, 142, 144, 146 148 and 150 of blades 110, 112 and 114 are shown in engaged positions, i.e. positions in which their respective EMI gasket mechanisms have been actuated.

To facilitate the following description, the illustration of blade 114 in FIG. 1B shows a corner 152 of the blade enlarged at 154. As illustrated with respect to blade 114, when the cam-levers 148 and 150 are engaged to actuate the EMI gasket mechanism, the jaws 156 and 158 are driven closer together, thereby squeezing the expandable EMI gasket 160 between the jaws, causing a portion of the expandable EMI gasket to protrude beyond edges 161 and 163 of the jaws. As is well-known in the art, the expandable EMI gasket 160 is electrically connected to the EMI shield of the bulkhead 124 and has an electrically conductive surface. The expandable EMI gasket 160 can, for example, be made of electrically conductive foam. Additional details of one possible implementation of the expandable EMI gasket 160 and the jaws 156 and 158 are provided below.

With continued reference to the blade 114 illustrated in FIG. 1B, when the EMI gasket mechanism is actuated, the protruding portion of the expandable EMI gasket 160 protrudes along preferably all four sides of the bulkhead 124, as shown at 162, 164 and 166 (bottom not visible). If the blade 114 had been installed in the blade system housing 102 prior to engaging the cam-levers 148 and 150, the protruding portion of the expandable EMI gasket 160 would contact mating surfaces, such as expandable EMI gaskets, of adjacent blades or mating surfaces, such as surface 168, of the opening 104 of the blade system housing. Thus, the expandable EMI gasket 160 of blade 114 would seal a space against passage of EMI radiation between the blade's bulkhead and one or more adjacent mating surfaces.

A preferred embodiment of the EMI gasket mechanism will now be described in detail. In particular, an implementation of the jaws, such as jaws 156 and 158 of blade 114, and an implementation of the expandable EMI gasket 160, will be described.

Figure 2:
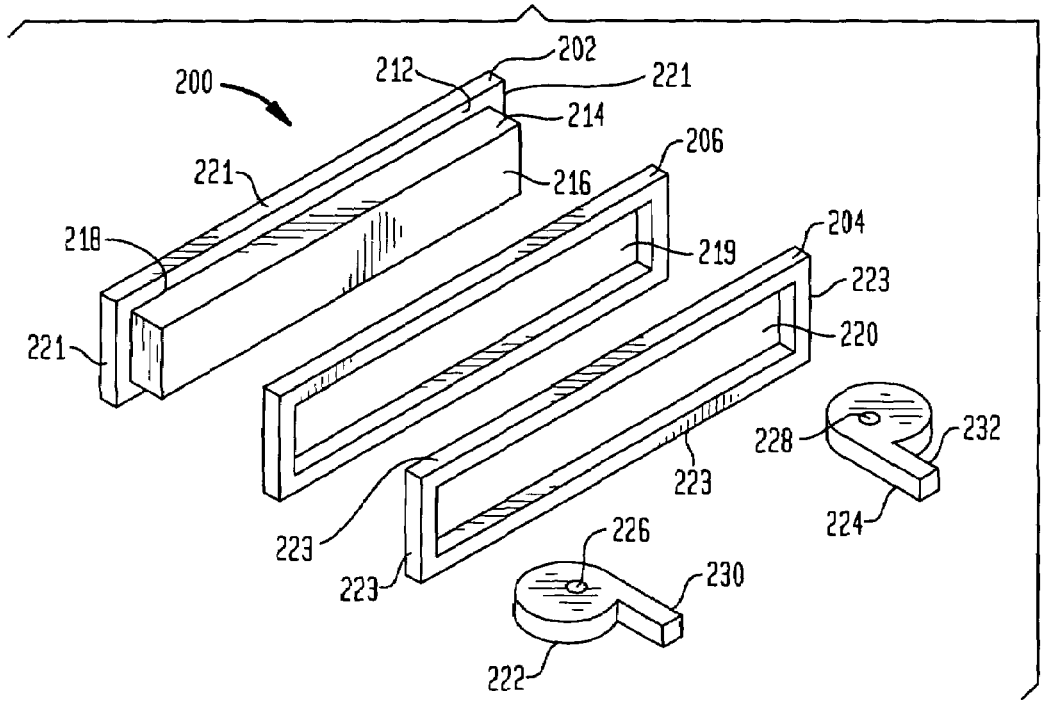
FIG. 2 is an exploded view of a first exemplary embodiment of an EMI gasket mechanism according to the present invention, which can be used in the blade system of FIG. 1.

FIG. 2 shows an exploded view of a preferred embodiment of an EMI gasket mechanism 200, including a stepped plate 202, a compression ring 204 and an expandable EMI gasket 206 between the stepped plate and the compression ring. The stepped plate 202 corresponds to jaw 158 of the blade 114 shown in FIG. 1B, and the compression ring 204 corresponds to jaw 156 of the blade. This correspondence can, however, be reversed. The stepped plate 202 includes a face 212 and a riser 214 leading to a raised step 216. The face 212 and the riser 214 define a rabbet 218. The expandable EMI gasket 206 includes an opening 219. The raised step 214 and the opening 219 in the expandable EMI gasket 206 are sized so the stepped plate 202 can receive the expandable EMI gasket in the rabbet 218. Preferably, the expandable EMI gasket 206 is sized so, when the expandable EMI gasket is not squeezed, its outer edges do not extend beyond outer edges 221 of the stepped plate 202. The compression ring 204 includes an opening 220 that is larger than the raised step 216, so the compression ring can slide along the riser 214 without binding. The compression ring also has outer edges 223.

Figure 3:
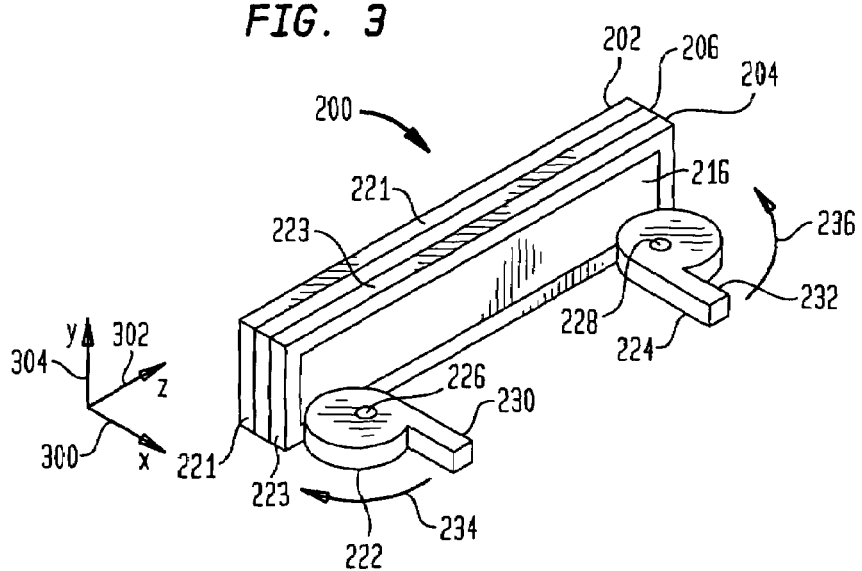
FIG. 3 is an unexploded view of the first exemplary EMI gasket mechanism of FIG. 2.

The EMI gasket mechanism 200 also includes preferably two cam-levers 222 and 224, which include two eccentric mounting holes 226 and 228 and handles 230 and 232. The cam-levers 222 and 224 are shown in unengaged positions, i.e. with the handles 230 and 232 extending preferably perpendicular to the plane of the compression ring 204. FIG. 3 shows an unexploded view of the EMI gasket mechanism 200. The cam-levers 222 and 224 are located adjacent the compression ring 204. The cam-levers 222 and 224 are pivotally mounted on axles (not shown) using the mounting holes 226 and 228, so the cam-levers can be pivoted by swinging their respective handles 230 and 232. The axles are preferably located at a fixed distance from the stepped plate 202.

When the handles 230 and 232 are swung as indicated by arrows 234 and 236 to an engaged position, the cam-levers cause the compression ring 204 to move toward the stepped plate 202 and, thereby, squeeze the expandable EMI gasket 206 between the face 212 and the compression ring 204, thus causing a portion of the expandable EMI gasket to protrude beyond edges 221 of the stepped plate. The EMI gasket also preferably, but not necessarily, protrudes beyond edges 223 of the compression ring 204. In cross-section, the expandable EMI gasket 206 is squeezed in one dimension, causing it to protrude in at least one other dimension. In the present example, the expandable EMI gasket 206 is squeezed in a Z dimension 300, thereby causing it to expand in an X dimension 302 and a Y dimension 304.

Once engaged, friction between the cam-levers 222 and 224 and the compression ring 204 preferably keeps the cam-levers from leaving their engaged positions until they are manually returned to the unengaged position. Alternatively, a bracket, lock or other mechanism can be used to secure the position of the cam-levers 222 and 224. Although in this embodiment the cam-levers 222 and 224 directly contact the compression ring 204, at least when the cam-levers are engaged, this need not be so. The cam-levers can be otherwise operably linked to the compression ring 204, and there can be other elements between the cam-levers and the compression ring.

Figure 4:
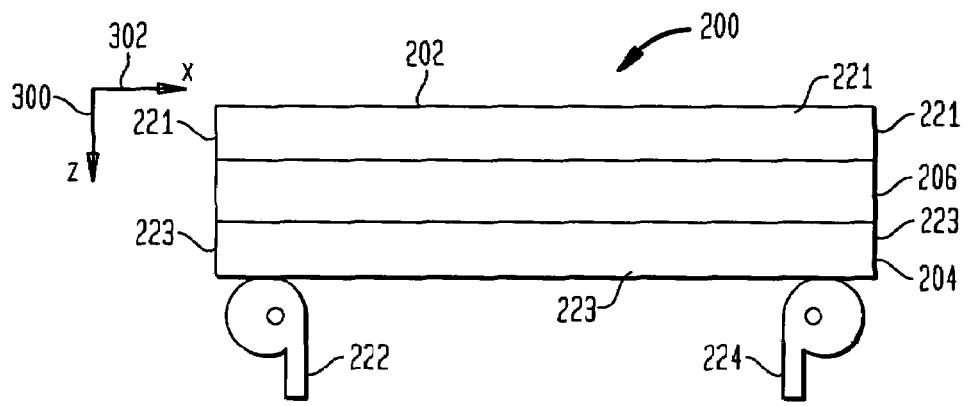
FIG. 4 is a top view of the first exemplary EMI gasket mechanism of FIG. 2, the EMI gasket mechanism being in an unengaged state.

FIG. 4 is a top view of the EMI gasket mechanism 200 with the cam-levers 222 and 224 shown in unengaged positions. With the cam-levers 222 and 224 unengaged, the expandable EMI gasket 206 preferably does not protrude beyond edges 221 of the stepped plate 202.

Figure 5:
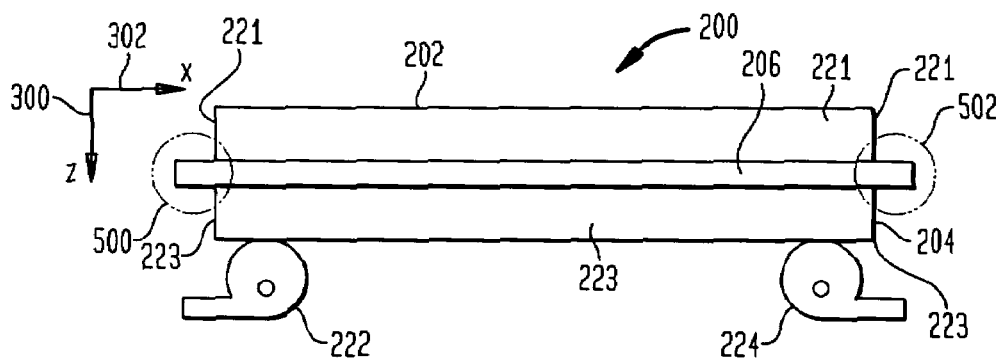
FIG. 5 is a top view of the first exemplary EMI gasket mechanism of FIG. 2, the EMI gasket mechanism being in an engaged state.

FIG. 5 is a top view of the EMI gasket 200 with the cam-levers 222 and 224 shown in engaged positions. With the cam-levers 222 and 224 engaged, the expandable EMI gasket 206 has been squeezed between the compression ring 204 and the stepped plate 202. Thus, the expandable EMI gasket 206 now protrudes beyond edges 221 of the stepped plate 202, as shown at 500 and 502.

Figure 6:
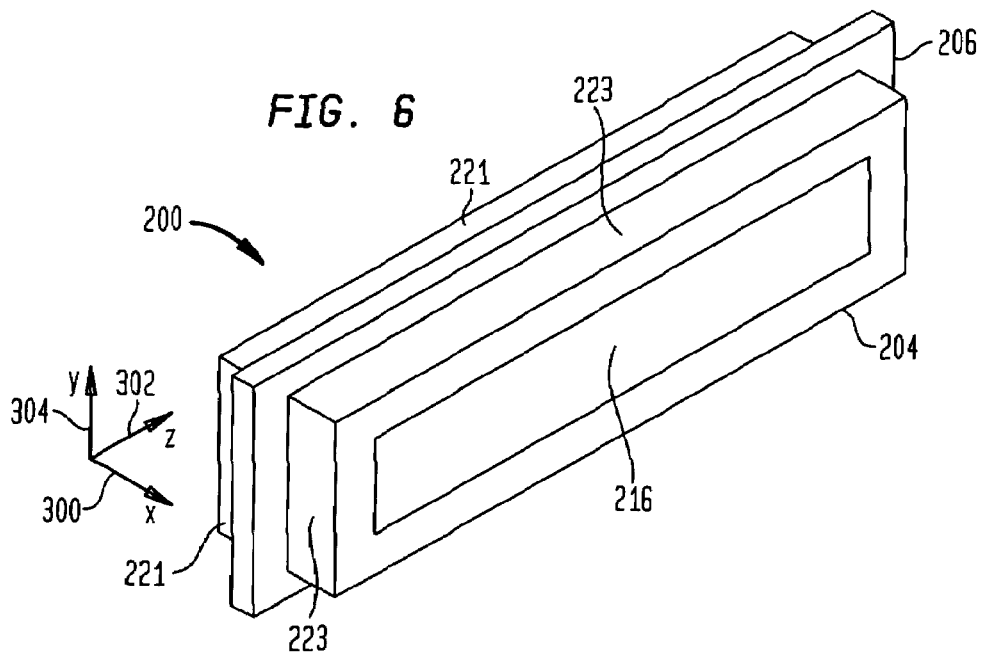
FIG. 6 is a perspective view of portions of the first exemplary EMI gasket mechanism of FIG. 2, the EMI gasket mechanism being in an engaged state.

FIG. 6 is a perspective view of the EMI gasket 200 after the expandable EMI gasket has been squeezed between the compression ring 204 and the stepped plate 202. For clarity, the cam-levers 222 and 224 are not shown in FIG. 6.

Returning for a moment to FIG. 2, the riser 214 is preferably located so as to prevent the expandable EMI gasket 206 from protruding inwardly, i.e. toward the raised step 216, when the expandable EMI gasket is squeezed between the compression ring 204 and the stepped plate 202, or at least limiting the amount of this protrusion. The riser 214 can, therefore, act as a stop. The riser 214 need not, however, limit inward protrusion of the expandable EMI gasket 206 if, absent such a stop, the expandable EMI gasket would protrude sufficiently beyond edges of the stepped plate 202 when the EMI gasket is squeezed between the compression ring 204 and the stepped plate. The stop is, therefore, optional.

The expandable EMI gasket 206 can be made of a solid or hollow elastomeric material that is either electrically conductive throughout or is provided with a conductive exterior surface, coating or covering. For example, the expandable EMI gasket 206 can be made of a conductive elastomer, a conductive foam, a knitted wire mesh, a non-conductive elastomer that is coated with a conductive paint or covered with a knitted wire mesh or other resilient material that, when squeezed between two jaws, protrudes into an available space.

Preferably, the expandable EMI gasket 206 is electrically connected to the EMI shield of the bulkhead. This is preferably accomplished by using an electrically conductive material to construct at least portions of the stepped plate 202 or the compression ring 204 that contact the expandable EMI gasket 206 and electrically connecting these portions to the EMI shield of the bulkhead. For example, all or portions of the face 212, the riser 214 or the compression ring 204 can be made of copper, aluminum, nickel, a conductive plastic or a nonconductive material on which a conductive coating has been applied.

The EMI gasket mechanism 200 preferably includes two cam-levers 222 and 224 to evenly distribute the force the cam-levers apply to the compression ring 204, so the expandable EMI gasket 206 protrudes roughly equally around the perimeter of the stepped plate 202 when the expandable EMI gasket is squeezed. More or fewer cam-levers are, however, acceptable. Alternatively, other mechanisms, such as screws, clamps throw levers, push buttons, turn knobs or toggles, can be substituted for the cam-levers, as long as the alternative mechanisms can cause the compression ring 204 to squeeze the expandable EMI gasket 206 against the stepped plate 202. For example, a screw passing through an unthreaded portion of the compression ring 204 and threaded into the stepped plate 202 can be rotated to drive together or spread apart the stepped plate and the compression ring. In addition, arrangements other than a stepped plate and compression ring can be used to squeeze the expandable EMI gasket 206. For example, the expandable EMI gasket 206 can be sandwiched between two plates. Furthermore, although the exemplary EMI gasket mechanism 200 is a rectangular, an EMI gasket mechanism according to the present invention can be provided in any shape.

Figure 7:
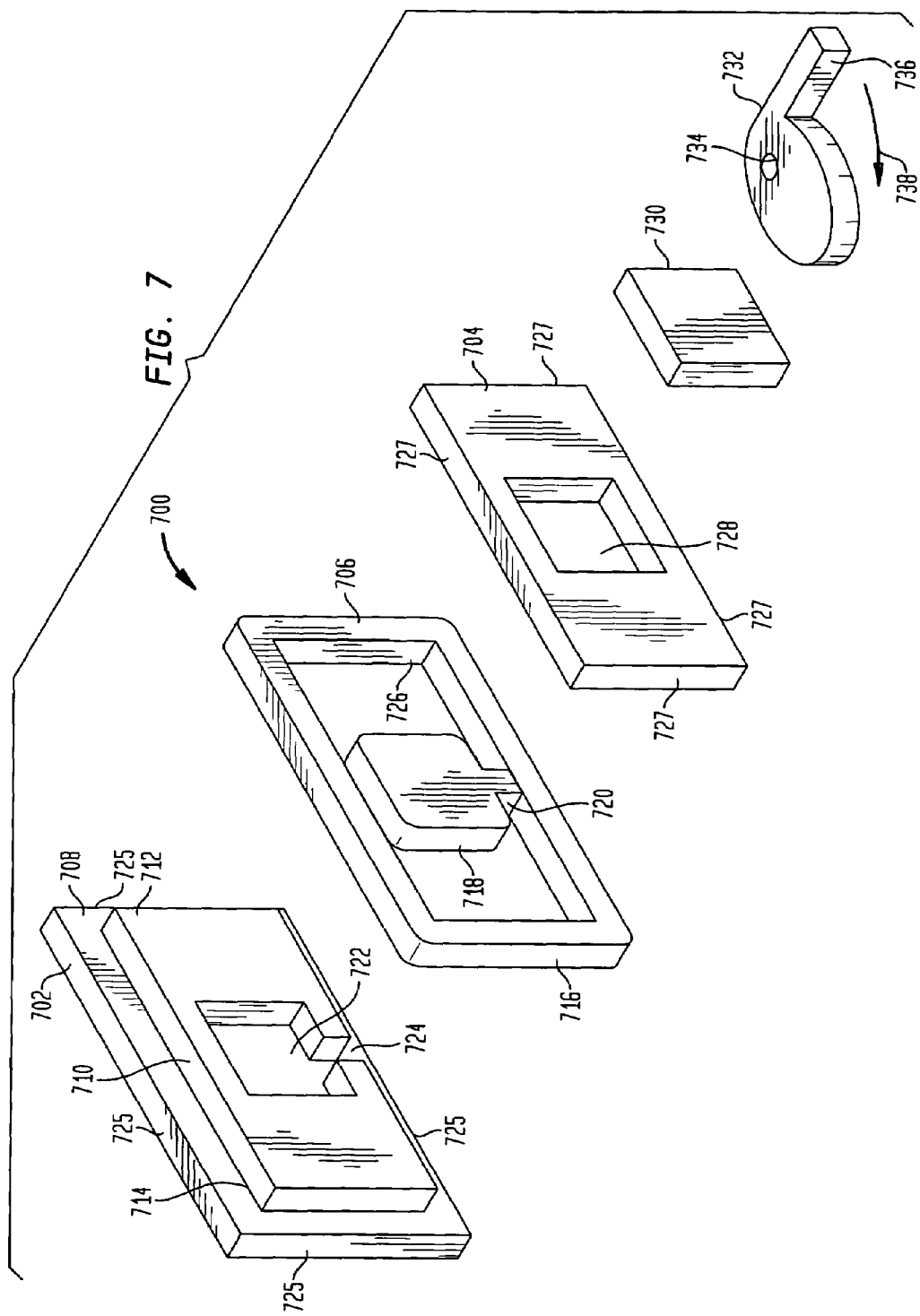
FIG. 7 is an exploded view of a second exemplary embodiment of an EMI gasket mechanism according to the present invention, which can be used in the blade system of FIGS. 1A–B

FIG. 7 is an exploded view of an alternative embodiment of an EMI gasket mechanism 700, including a stepped plate 702, a plate 704 and an inflatable, expandable EMI gasket 706 between the stepped plate and the plate. The stepped plate 702 and the plate 704 correspond to jaws of a bulkhead, as previously described. The stepped plate 702 includes a face 708 and a riser 710 leading to a raised step 712. The face 708 and the riser 710 define a rabbet 714. The inflatable, expandable EMI gasket 706 includes a hollow, inflatable, expandable portion 716 (hereinafter referred to as an "inflatable portion") and a compressible bladder 718 in fluid communication with an inflatable portion via a neck portion 720. The inflatable, expandable EMI gasket 706 is preferably filled with a relatively incompressible fluid, such as water. Alternatively, the inflatable, expandable EMI gasket 706 can be filled with a more compressible substance, such as air.

The raised step 712 includes a hollow portion 722 and a gap 724. The raised step 712 and an inside dimension 726 of the inflatable, expandable EMI gasket 706 are sized so the stepped plate 702 can receive the inflatable, expandable EMI gasket in the rabbet 714. The inflatable, expandable EMI gasket 706 is preferably sized so no portion of the gasket protrudes beyond edges 725 of the stepped plate 702 when the gasket is not inflated. The hollow portion 722 and the gap 724 of the raised step 712 are sized and positioned to receive the bladder 718 and the neck portion 720, respectively. The plate 704 includes an opening 728 sized and positioned to correspond with the bladder 718. A pressure plate 730 is disposed within the opening 728 in the plate 704. The opening 728 is larger than the pressure plate 730, so that pressure plate can slide within the opening without binding.

That EMI gasket mechanism 700 also includes a cam-lever 732, which includes an eccentric mounting hole 734 and a handle 736. The cam-lever 732 is shown in an unengaged position. The cam-lever 732 is located adjacent to pressure plate 730. The cam-lever 732 is pivotally mounted on an axle (not shown) using the mounting hole 734, so the cam lever can be pivoted by its handle 736. The axle is preferably located a fixed distance from the stepped plate 702.

When the handle 736 is swung as indicated by arrow 738 to an engaged position, the cam-lever causes the compression plate 730 to move toward the stepped plate 702 and, thereby, squeeze the bladder 218 between the stepped plate and the pressure plate. Water, air or another fluid in the bladder 718 is, thereby, expelled from the bladder and travels through the neck portion 720 into the inflatable portion 716 of the inflatable, expandable EMI gasket 706. Thus, the inflatable, expandable EMI gasket 706 is inflated. As a result of this inflation, a portion of the inflatable, expandable EMI gasket 706 protrudes beyond edges 725 of the stepped plate 702. The expandable EMI gasket 706 also preferably, but not necessarily, expands beyond edges 727 of plate 704.

As in the previously described embodiment, the riser 710 is preferably located so as to prevent the inflatable, expandable EMI gasket 706 from protruding inwardly, i.e. toward the raised step 712, when the inflatable, expandable EMI gasket is inflated, or at least limiting the amount of this protrusion. The riser 710 can, therefore, act as a stop. The riser 710 need not, however, limit inward protrusion of the inflatable, expandable EMI gasket 706 if, absent such a stop, the inflatable, expandable EMI gasket would protrude sufficiently beyond edges 725 of the stepped plate 702 when the EMI gasket is inflated. The stop is, therefore, optional.

As in the previously described embodiment, at least the surface of the inflatable, expandable EMI gasket 706 is electrically conductive and electrically connected to an EMI shield in a bulkhead. Also as previously described, more cam-levers can be used. Alternatively, other mechanisms, as previous described, can be substituted for the cam-lever, as long as the alternative mechanisms can cause the compressible bladder 718 to be squeezed.

Instead of the bladder 718, other embodiments can omit the pressure plate 730 and include a piston pump or other pump mechanism operatively linked to the cam-lever 732 (or its alternative) to inflate the inflatable, expandable EMI gasket 706. Alternatively, the inflatable, expandable EMI gasket 706 can omit the pump mechanism entirely and instead provide a fitting, through which a fluid or gas can be introduced from an external source to inflate the gasket. Other comments and alternatives, discussed in relation to the previous-described embodiment, also apply to this embodiment.

For purposes of providing an example, the present invention has been described in the context of a blade system. One of ordinary skill in the art can, however, apply the teachings herein to other situations that require apparatus or methods for sealing a space, i.e. closing a gap, against passage of EMI radiation. For example, if a blade system is not fully populated with blades, blank or dummy bulkheads can be used to fill remaining openings in the blade systems front panel. These blank bulkheads can employ an embodiment of the present invention to help maintain a continuous EMI shield across the front panel of the blade system. In addition, such a blank bulkhead, or any device that employs the inventive EMI gasket mechanism, can include wires passing through the device, from one side of the devices EMI shield to the other side.

Figure 8:
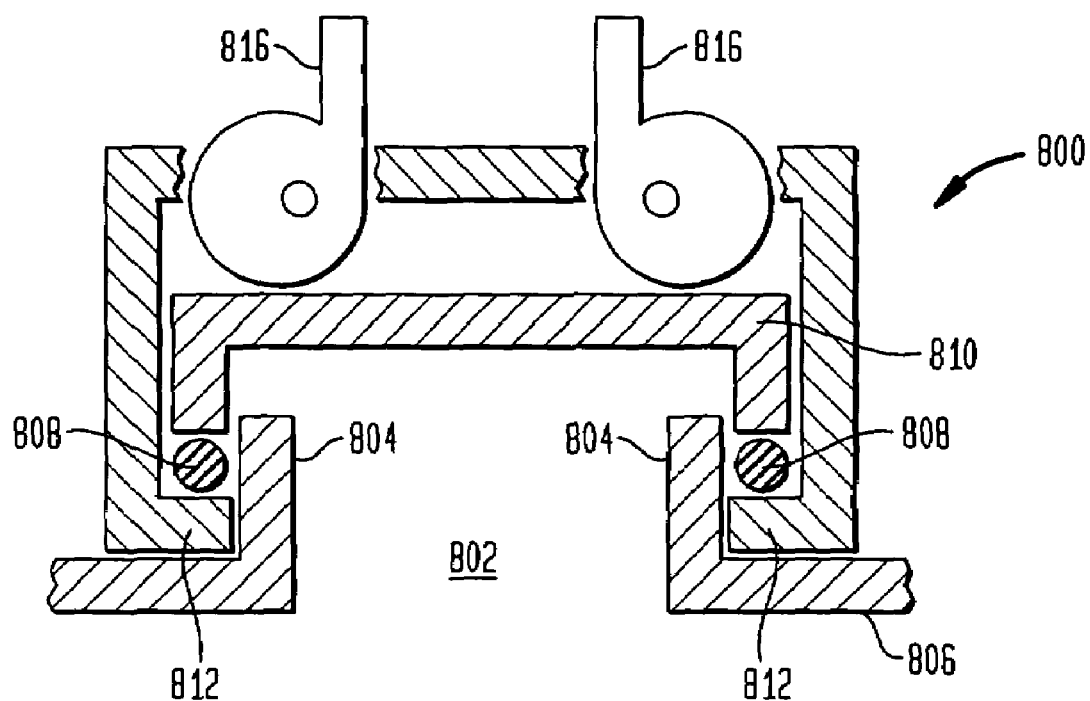
FIG. 8 is a cross-section view of a third exemplary embodiment of an EMI gasket mechanism according to the present invention.

Furthermore, embodiments of the present invention need not necessarily cause a portion of an expandable EMI gasket to protrude outward of a device that employs the inventive EMI gasket mechanism. For example, FIG. 8 illustrates a cross-section of a lid 800 that closes an opening 802 defined by flanges 804 in a panel 806. An expandable EMI gasket 808 is disposed, and can be squeezed, between a compression ring 810 and inwardly-turned portions 812 of the lid 800. As cam-levers 814 and 816 (or their alternatives) are swung, the expandable EMI gasket 808 is squeezed and a portion of it protrudes toward, and contacts, the flanges 804, thereby sealing a space between the flanges and the lid 800 against passage of EMI radiation.

Although the expandable EMI gasket has been described as protruding on all sides of a device that employs the inventive EMI gasket mechanism, in other practices of the invention the EMI gasket mechanism can be configured so the expandable EMI gasket protrudes on fewer than all sides or on only portions of one or more sides. For example, although the expandable EMI gasket 206 is shown in FIG. 2 as a rectangular loop that extends all the way around the riser 214, the expandable EMI gasket could be provided in an "L" or squared-off "U" shape or as a single linear segment and extend only part way around the riser. Furthermore, the EMI gasket mechanism can be included in an opening, such as the opening 104 (FIG. 1A) of blade system housing 102, rather than in bulkheads of devices that are to be inserted into the blade system.

The terms and expressions employed herein are used as terms of description, not of limitation. There is no intention, therefore, in using these terms and expressions to exclude any equivalents of the features shown or described or portions thereof. Practitioners in the art will recognize further features and advantages of the invention based on the above-described embodiments and that other modifications are possible within the scope of the invention claimed. Accordingly, the invention is not to be limited by what has been particularly shown and described, except as indicated by the appended claims. All publications and references cited herein are expressly incorporated herein by reference in their entity.

What is claimed is:

1. An EMI gasket mechanism for sealing a space anterior to a surface, thereby inhibiting or preventing passage of EMI radiation through the space, the EMI gasket mechanism comprising:
   a first jaw;
   a second jaw spaced apart from the first jaw by a distance, the first and second jaws defining a region therebetween;
   a resilient EMI gasket disposed in the region; and
   an actuator operably linked to the first and second jaws and configured to reduce the distance between the first and second jaws when the actuator is activated, thereby squeezing the resilient EMI gasket between the first and second jaws and causing a portion of the resilient EMI gasket to protrude beyond an edge of one of either the first and second jaws such that the protruding portion of the resilient EMI gasket is forced into contact with the surface, thereby sealing the space anterior to the surface against passage of EMI radiation.

2. The EMI gasket mechanism of claim 1, wherein the first jaw has an outer edge and, when the actuator is activated and the resilient EMI gasket is squeezed between the first and second jaws, the resilient EMI gasket protrudes beyond the outer edge of the first jaw.

3. The EMI gasket mechanism of claim 1, wherein the first jaw has an outer edge and the second jaw has an outer edge and, when the actuator is activated and the resilient EMI gasket is squeezed between the first and second jaws, the resilient EMI gasket protrudes beyond the outer edge of the first jaw and beyond the outer edge of the second jaw.

4. The EMI gasket mechanism of claim 1, wherein the actuator comprises a cam-lever.

5. The EMI gasket mechanism of claim 1, wherein the actuator comprises a threaded shaft.

6. The EMI gasket mechanism of claim 1, further comprising a stop adjacent the resilient EMI gasket, wherein, when the actuator is activated and the resilient EMI gasket is squeezed between the first and second jaws, the stop limits protrusion of the resilient EMI gasket in a direction away from the surface.

7. The EMI gasket mechanism of claim 1, wherein the first jaw comprises a stepped plate.

8. The EMI gasket mechanism of claim 1, wherein the second jaw comprises a compression ring.

9. The EMI gasket mechanism of claim 1, wherein the first jaw comprises the surface.

10. An EMI gasket mechanism for sealing a space anterior to a surface, thereby inhibiting or preventing passage of EMI radiation through the space, the EMI gasket mechanism comprising:
    an inflatable resilient EMI gasket;
    a pump in fluid communication with the inflatable resilient EMI gasket; and
    an actuator operably linked to the pump and configured to operate the pump when the actuator is activated, thereby inflating the resilient EMI gasket and causing a portion of the resilient EMI gasket to protrude, whereby the protruding portion of the resilient EMI gasket is forced into contact with the surface, thereby sealing the space anterior to the surface against passage of EMI radiation.

11. The EMI gasket mechanism of claim 10, wherein the actuator comprises a cam-lever.

12. The EMI gasket mechanism of claim 10, wherein the actuator comprises a threaded shaft.

13. The EMI gasket mechanism of claim 10, wherein the pump comprises a bladder and the actuator is configured to squeeze the bladder when the actuator is activated.

14. The EMI gasket mechanism of claim 10, wherein the pump comprises a piston and the actuator is configured to move the piston when the actuator is activated.

15. The EMI gasket mechanism of claim 10, further comprising a stop adjacent the resilient EMI gasket, wherein, when the actuator is activated and the resilient EMI gasket is inflated, the stop limits protrusion of the resilient EMI gasket in a direction away from the surface.

16. A method of sealing a space anterior to a surface, thereby inhibiting or preventing passage of EMI radiation through the space, comprising:
  positioning a resilient EMI gasket around a riser of a stepped plate and in the space anterior to the surface; and
  operating a cam-lever to squeeze the resilient EMI gasket against a face of the step, thereby causing a portion of the resilient EMI gasket to expand circumferentially to protrude beyond an anterior outer edge of the stepped plate to come into contact with and be forced against the surface.

17. The method of claim 16, further comprising:
  limiting protrusion of the resilient EMI gasket in an anterior direction away from the surface due to the riser.

18. A method of installing a device in a housing, wherein installation of the device requires sealing a space between the device and a surface on the housing or on an adjacent device against passage of EMI radiation through the space, comprising:
  inserting the device into the housing; and
  positioning a resilient EMI gasket in the space;
  after inserting the device into the housing, squeezing the resilient EMI gasket in a manner that does not utilize insertion forces applied to the device, thereby causing a portion of the resilient EMI gasket to protrude beyond an edge of the device such that the protruding portion of the resilient EMI gasket is forced into contact with the housing surface.

19. A method of sealing a space anterior to a surface, thereby inhibiting or preventing passage of EMI radiation through the space, comprising:
  positioning a resilient EMI gasket around a riser of a stepped plate in the space anterior to the surface;
  rotating a threaded shaft to squeeze the resilient EMI gasket against a face of the step, thereby causing a portion of the resilient EMI gasket to protrude beyond an anterior outer edge of the stepped plate to forcibly contact the surface; and
  limiting protrusion of the resilient EMI gasket in at least one direction away from the surface by using the riser.

20. A method of installing a device in a housing, wherein installation of the device requires sealing a space between the device and a surface on the housing or on an adjacent device against passage of EMI radiation through the space, comprising:
  inserting the device into the housing; and
  positioning an inflatable resilient EMI gasket in the space;
  inflating the inflatable resilient EMI gasket in a manner that does not rely on insertion force applied to the device, thereby causing a portion of the inflatable resilient EMI gasket to protrude beyond an anterior outer edge of the device to come into contact with the housing surface,
  wherein one of either the device or the housing comprises the EMI gasket mechanism.

21. A method of sealing a space anterior to a surface, thereby inhibiting or preventing passage of EMI radiation through the space, comprising:
  positioning an inflatable resilient EMI gasket in the space anterior to the surface; and
  squeezing a bladder that is in fluid communication with the inflatable resilient EMI gasket to inflate the inflatable resilient EMI gasket, thereby causing a portion of the inflatable resilient EMI gasket to come into contact with and be forced against the surface.

22. The method of claim 21, further comprising:
  limiting protrusion of the inflatable resilient EMI gasket in a direction away from the surface.

23. A method of sealing a space anterior to a surface, thereby inhibiting or preventing passage of EMI radiation through the space, comprising:
  positioning an inflatable resilient EMI gasket in the space anterior to the surface; and
  rotating a threaded shaft to inflate the inflatable resilient EMI gasket, thereby causing a portion of the inflatable resilient EMI gasket to come into contact with and be forced against the surface.

24. The method of claim 23, further comprising limiting protrusion of the inflatable resilient EMI gasket in a direction away from the surface.

* * * * *